(12) United States Patent
Sasaki et al.

(10) Patent No.: US 6,998,764 B2
(45) Date of Patent: Feb. 14, 2006

(54) MULTILAYER PIEZOELECTRIC ELEMENT

(75) Inventors: Satoshi Sasaki, Yuri-gun (JP); Kazushi Tachimoto, Yuri-gun (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/782,797

(22) Filed: Feb. 23, 2004

(65) Prior Publication Data

US 2005/0001519 A1    Jan. 6, 2005

(30) Foreign Application Priority Data

Feb. 27, 2003    (JP)    ............................ P2003-051762

(51) Int. Cl.
*H01L 41/08* (2006.01)
*B01J 2/45* (2006.01)

(52) U.S. Cl. .................. 310/365; 310/364; 347/70; 347/71; 347/68

(58) Field of Classification Search ........ 310/365–366; 347/50, 68–72
See application file for complete search history.

(56) References Cited

U.S. PATENT DOCUMENTS 6,601,949 B1 *    8/2003    Kitahara .................. 347/70

2004/0130604 A1 *    7/2004    Watanabe et al. .............. 347/71
2005/0179747 A1 *    8/2005    Iamai et al. .................. 347/71

FOREIGN PATENT DOCUMENTS

| JP | A 2002-36544 | 2/2002 |
| JP | A 2002-254634 | 9/2002 |
| JP | A 2002-254657 | 9/2002 |

* cited by examiner

*Primary Examiner*—Darren Schuberg
*Assistant Examiner*—J. Aguirrechea
(74) *Attorney, Agent, or Firm*—Oliff & Berridge, PLC

(57) ABSTRACT

In a piezoelectric layer of a multilayer piezoelectric element, a portion held between an electrode portion of an individual electrode and a common electrode becomes an active portion. When a voltage is applied between the individual electrode and common electrode, the active portion is displaced. The individual inner electrode includes a connection portion connected to the conductive substance within a through hole of the piezoelectric layer. The connection portion is formed at a position shifted from the longitudinal centerline of the electrode portion. This can restrain the displacement of the electrode portion following the active portion of the piezoelectric layer from being suppressed by the connection with the conductive substance as compared with a case where the connection portion is formed on the centerline of the electrode portion. Therefore, the amount of displacement of the active portion in the piezoelectric layer can be prevented from decreasing.

6 Claims, 14 Drawing Sheets

MULTILAYER PIEZOELECTRIC ELEMENT

BACKGROUND OF THE INVENTION

1. Field of the Invention

The present invention relates to a multilayer piezoelectric element used as a driving source for minute displacements, such as valve control of micropumps.

2. Related Background Art

This kind of conventional multilayer piezoelectric element is disclosed in Japanese Patent Application Laid-Open No. 2002-254634, for example. In this multilayer piezoelectric element, piezoelectric layers each patterned with a number of individual electrodes and piezoelectric layers each patterned with a common electrode are alternately laminated, whereas the individual electrodes aligning in the thickness direction of the multilayer piezoelectric element are connected to each other by conductive substances by way of through holes formed in the piezoelectric layers. When a voltage is applied between a predetermined individual electrode and a common electrode, such a multilayer piezoelectric element can selectively displace an active portion (where a distortion is generated by a piezoelectric effect) corresponding to the predetermined individual electrode in the piezoelectric layers.

SUMMARY OF THE INVENTION

However, since respective ends of the individual electrodes aligning in the thickness direction are connected to each other by conductive substances, the above-mentioned conventional multilayer piezoelectric element may be problematic in that active portions are restrained from being displaced between the individual electrodes, thus lowering their amount of displacement. Such a problem becomes more remarkable as the individual electrodes are made smaller in order to reduce the size of the multilayer piezoelectric element or attain a higher integration of individual electrodes.

In view of such circumstances, it is an object of the present invention to provide a multilayer piezoelectric element which can prevent the amount of displacement of active portions in piezoelectric layers from decreasing.

For achieving the above-mentioned object, the present invention provides a multilayer piezoelectric element comprising a first internal electrode; a second internal electrode; and a piezoelectric layer, disposed between the first and second internal electrodes, including a through hole in which a conductive substance is disposed; wherein the first internal electrode has an electrode portion for producing, in cooperation with the second internal electrode, an electric field in the piezoelectric layer, and a connection portion connected to the conductive substance in the through hole; and wherein the connection portion is formed at a position shifted from the longitudinal centerline of the electrode portion.

In the piezoelectric layer of this multilayer piezoelectric element, a portion held between the electrode portion of the first and second internal electrodes becomes an active portion, which is displaced when a voltage is applied between the first and second inner electrodes. The first inner electrode includes a connection portion connected to the conductive substance in the through hole of the piezoelectric layer, which is formed at a position shifted from the longitudinal centerline of the electrode portion. This can restrain the displacement of the electrode portion following the active portion of the piezoelectric layer from being suppressed by the connection with the conductive substance. Therefore, this multilayer piezoelectric element can prevent the amount of displacement of the active portion in the piezoelectric layer from decreasing. Here, "the longitudinal centerline of the electrode portion" refers to a line passing substantially the center of the width (in the direction orthogonal to the longitudinal direction) of the electrode portion along the longitudinal direction thereof.

Preferably, the first internal electrode is an individual electrode, and a plurality of individual electrodes are formed on one face of the piezoelectric layer. This is because, as mentioned above, the suppression of the displacement of the electrode portion following the active portion of the piezoelectric layer is alleviated in the first internal electrode, whereby a plurality of internal electrodes formed as individual electrodes can be made smaller.

Preferably, the plurality of individual electrodes are disposed in a matrix on the piezoelectric layer. This makes it possible for the plurality of individual electrodes to be disposed efficiently on the piezoelectric layer.

Preferably, the connection portion is positioned between adjacent electrode portions. When the first internal electrode is an individual electrode, and a plurality of individual electrodes are formed, it is necessary to provide a predetermined gap between adjacent electrode portions in order to electrically separate them from each other. Positioning the connection portion in the gap allows the individual electrodes to be disposed more efficiently in the piezoelectric layer. This allows the multilayer piezoelectric element to be made smaller or the individual electrodes to attain a higher integration, while keeping the area of each active portion.

Preferably, the second internal electrode is a common electrode, and is formed on the other face of the piezoelectric layer while having a shape to overlay the electrode portion across the piezoelectric layer. Forming the second internal electrode as a common electrode as such facilitates the forming of the second internal electrode and the positioning with respect to its opposing first internal electrode. Since the second internal electrode has a shape to overlay the electrode portion across the piezoelectric layer, the portion of the piezoelectric layer opposing each electrode portion as a whole can efficiently be used as an active portion.

Preferably, the multilayer piezoelectric element comprises an outermost layer laminated on a top of a plurality of piezoelectric layers, and the outermost layer has an external electrode opposed to the connection portion in a thickness direction of the piezoelectric element. While a lead to connect with a driving power supply, for example, is attached to the external electrode formed with the outermost layer, the external electrode is formed at a position opposed to the connection portion of the first internal electrode (i.e., the corresponding position in the thickness direction of the piezoelectric element). This can prevent the lead from pressing the electrode portion of the first internal electrode and the active portion of the piezoelectric layer and inhibiting their displacement.

DESCRIPTION OF THE PREFERRED EMBODIMENTS

In the following, preferred embodiments of the present invention will be explained in detail with reference to the accompanying drawings. Constituents identical to each other will be referred to with numerals identical to each other without repeating their overlapping explanations.

[First Embodiment]

Figure 1:
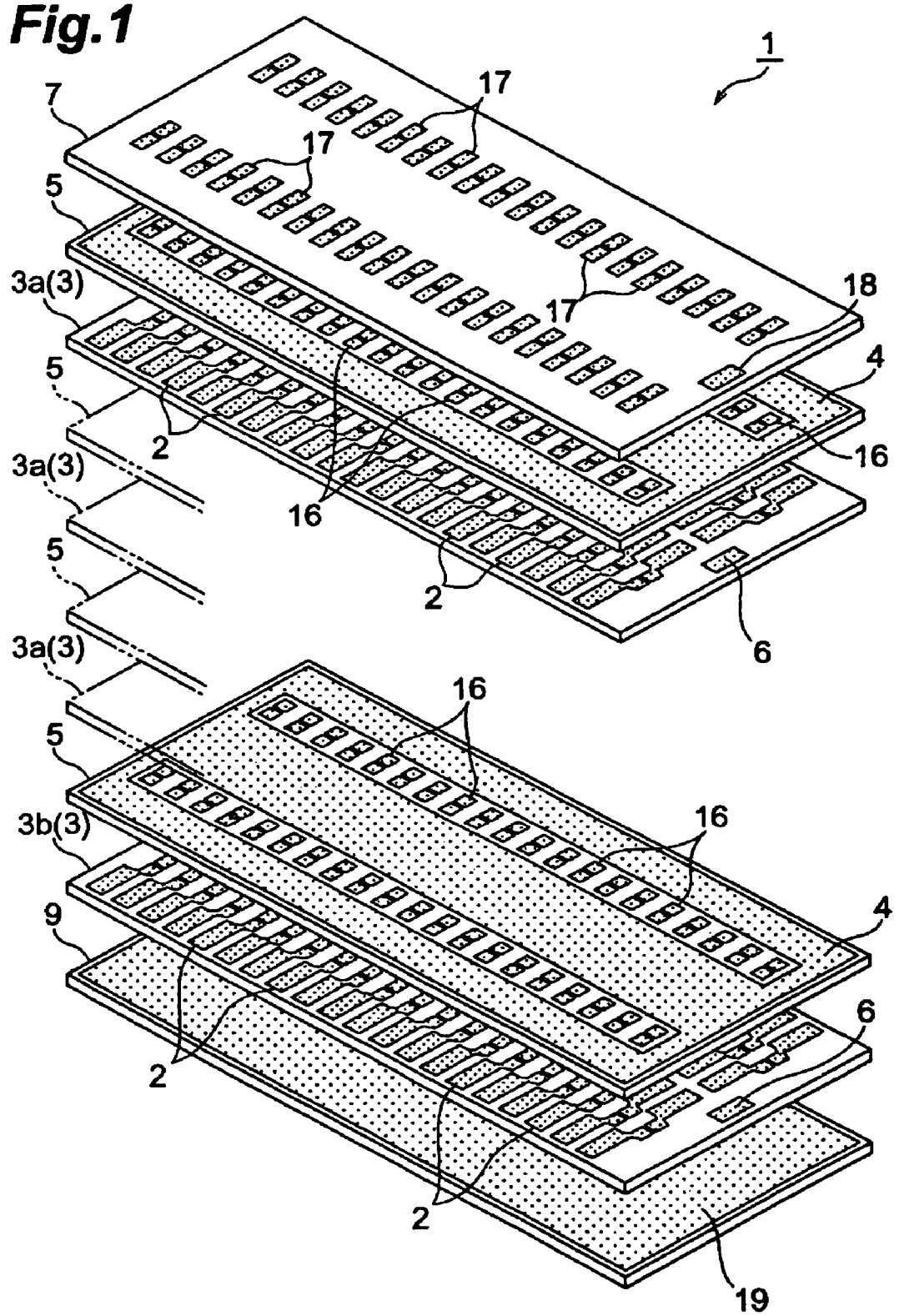
FIG. 1 is an exploded perspective view of a first embodiment of the multilayer piezoelectric element in accordance with the present invention.

As shown in FIG. 1, the multilayer piezoelectric element 1 in accordance with the first embodiment is constructed such that four piezoelectric layers 3 each formed with individual electrodes (first inner electrodes) 2 and four piezoelectric layers 5 each formed with a common electrode (second inner electrode) 4 are alternately laminated, and thus formed laminate is held between a piezoelectric layer (outermost layer) 7 to be formed with terminal electrodes and a base piezoelectric layer 9 from the upper and lower sides, respectively. In other words, the piezoelectric layers 3, 5 are held between the individual electrodes 2 and common electrodes 4.

Each of the piezoelectric layers 3, 5, 7, 9, is mainly composed of ceramics such as lead zirconate titanate and is formed into a thin rectangular sheet of 10 mm×30 mm with a thickness of 30 μm, for example. The individual electrodes 2 and common electrodes 4 are mainly composed of silver and palladium, for example, and formed as patterns by screen printing. The same applies to electrodes which will be explained in the following.

Figure 2:
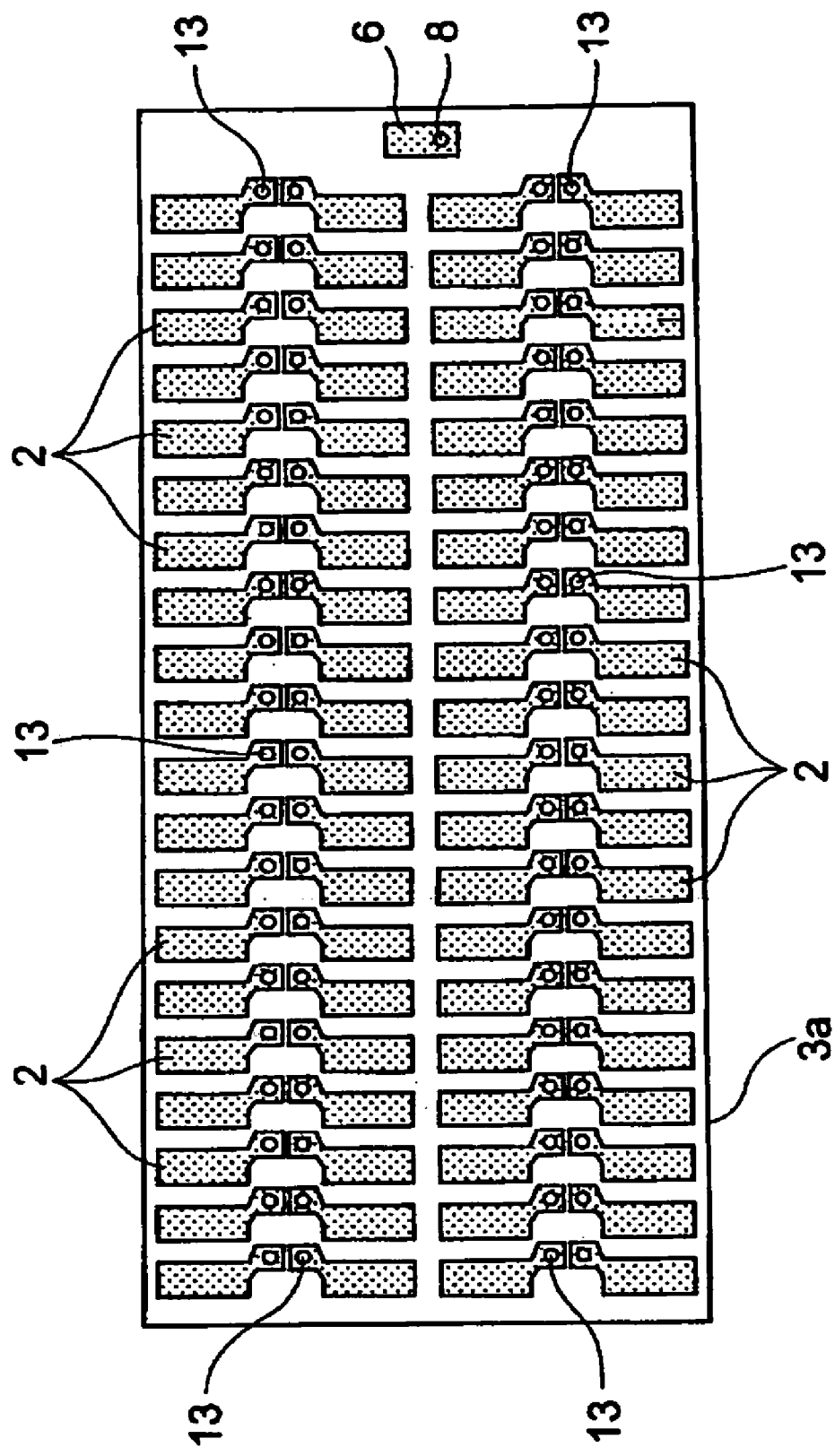
FIG. 2 is a plan view of the third, fifth, and seventh piezoelectric layers in the multilayer piezoelectric element shown in FIG. 1.

In the multilayer piezoelectric element 1, a number of individual electrodes 2 are disposed in a matrix on the upper face of each of the third, fifth, and seventh piezoelectric layers 3a from the uppermost (outermost) piezoelectric layer 7 as shown in FIG. 2. Assuming that rows align in the longitudinal direction of the piezoelectric layer 3a, and that columns align in a direction perpendicular to the longitudinal direction, the individual electrodes are arranged in a matrix of 4 columns by 75 rows (only 4 columns by 20 rows being depicted for the sake of clarification), for example. Disposing a number of individual electrodes 2 into a matrix as such enables an efficient arrangement with respect to the piezoelectric layer 3a. Adjacent individual electrodes 2, 2 have a predetermined gap therebetween, so as to be electrically separated from each other, and kept from affecting each other upon vibration.

An end part of the upper face of each piezoelectric layer 3a is formed with an intermediate electrode 6 for electrically connecting respective common electrodes 4, 4 of the piezoelectric layers 5 positioned on the upper and lower sides. The intermediate electrode 6 is connected directly thereunder to a conductive substance in a through hole 8 formed in the piezoelectric layer 3a.

Figure 3:
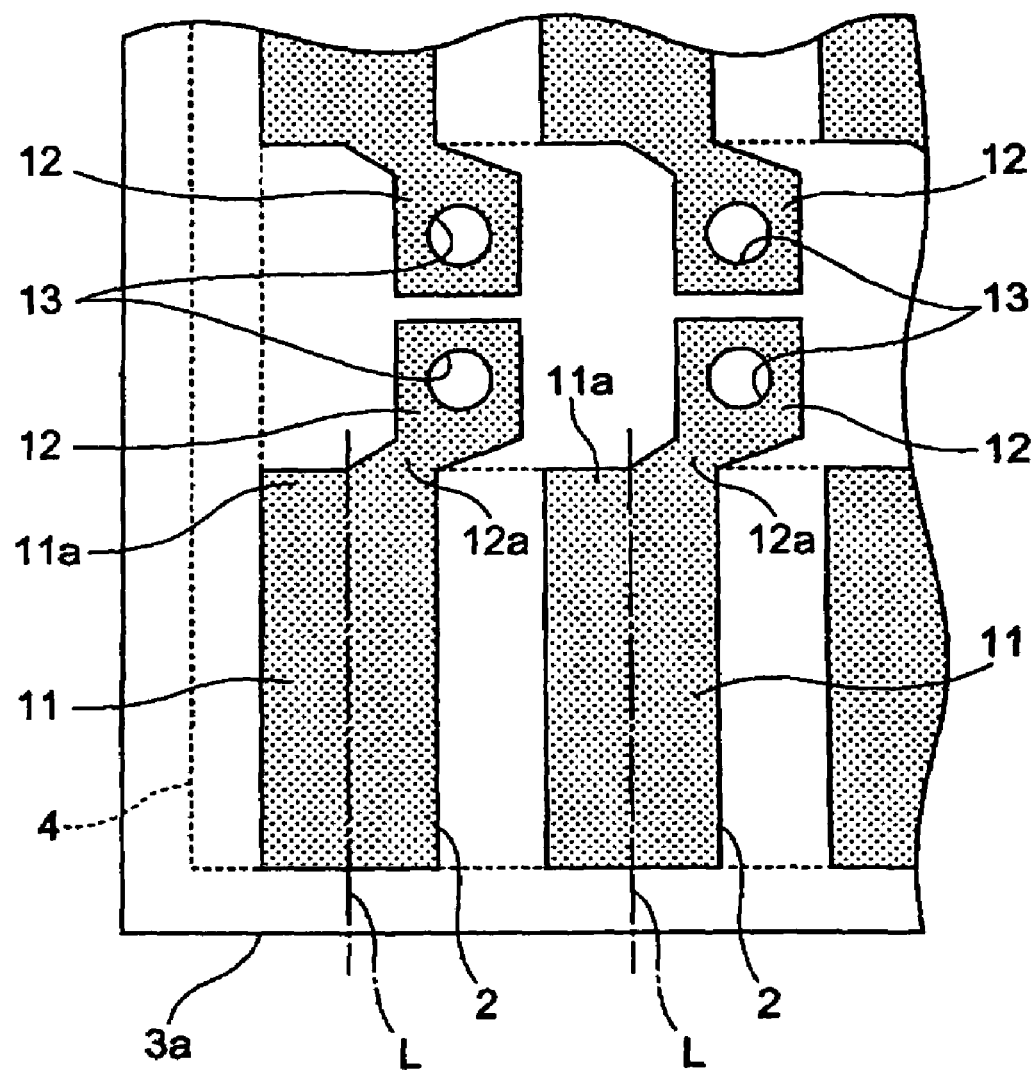
FIG. 3 is an enlarged plan view showing a main part of the piezoelectric layers shown in FIG. 2.

As shown in FIG. 3, the individual electrode 2 includes a rectangular electrode portion 11 for producing, in cooperation with the common electrode 4, an electric field in the piezoelectric layer 3a. The electrode portion 11 is arranged such that its longitudinal direction is orthogonal to the longitudinal direction of the piezoelectric layer 3a. A square connection portion 12 joins with one end part 11a of the electrode portion 11 in the longitudinal direction. The electrode portion 11 and connection portion 12 are integrally formed by way of a narrow neck portion 12a such that the center (i.e., center of gravity) position of the connection portion 12 is displaced from the longitudinal centerline L of the electrode portion 11 (i.e., line passing the center of gravity of the electrode portion 11).

Thus shaped individual electrodes 2 are disposed such that the connection portions 12 are positioned adjacent each other in the first and second columns and in the third and fourth columns. Each connection portion 12 is connected directly thereunder to the conductive substance in the through hole 13 formed in the piezoelectric layer 3a.

Figure 4:
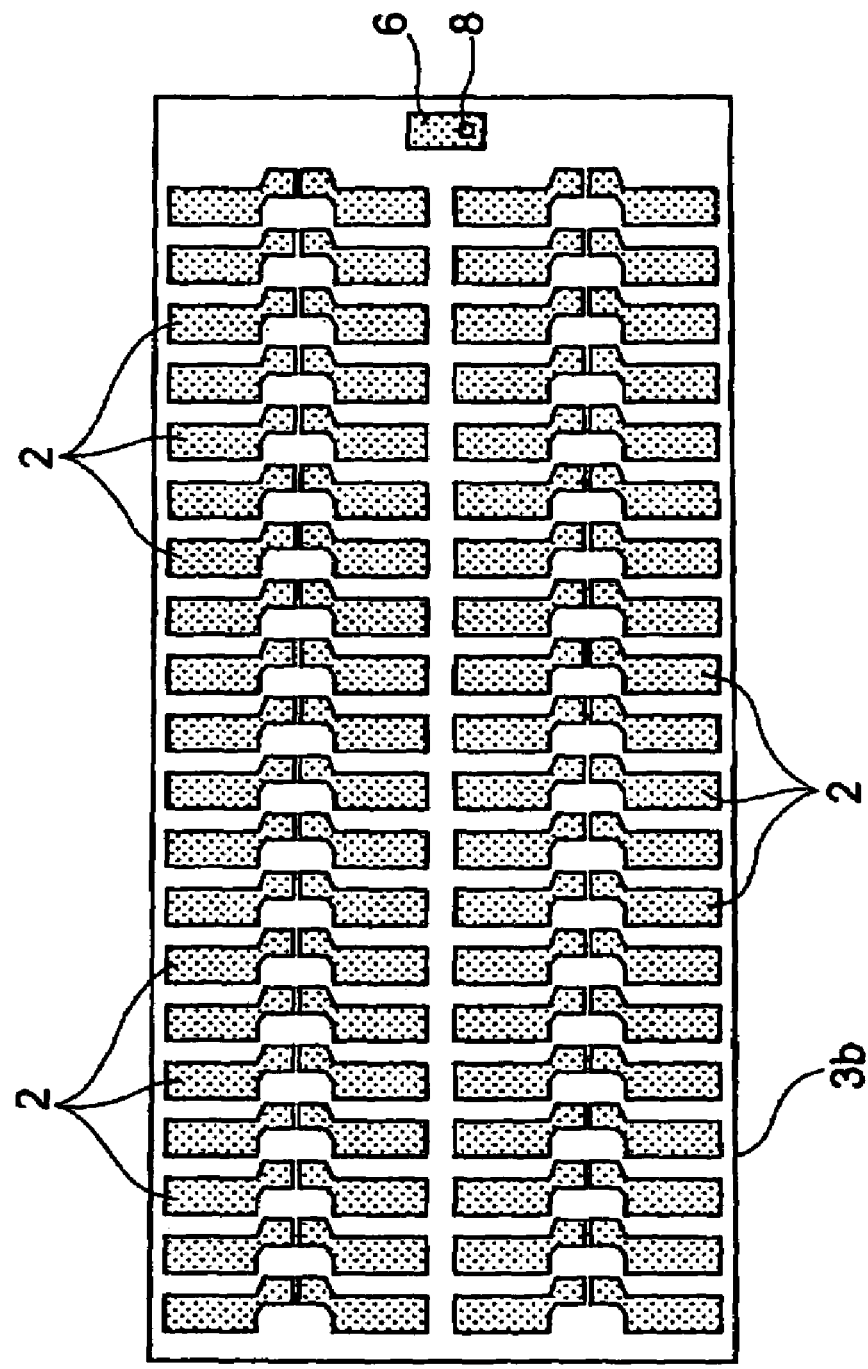
FIG. 4 is a plan view of the ninth piezoelectric layer in the multilayer piezoelectric element shown in FIG. 1.

Individual electrodes 2 are also disposed in a matrix on the upper face of the ninth piezoelectric layer 3b as in the third, fifth, and seventh piezoelectric layers 3a. However, as shown in FIG. 4, the ninth piezoelectric layer 3b differs from the piezoelectric layers 3a in that no through holes 13 are formed.

Figure 5:
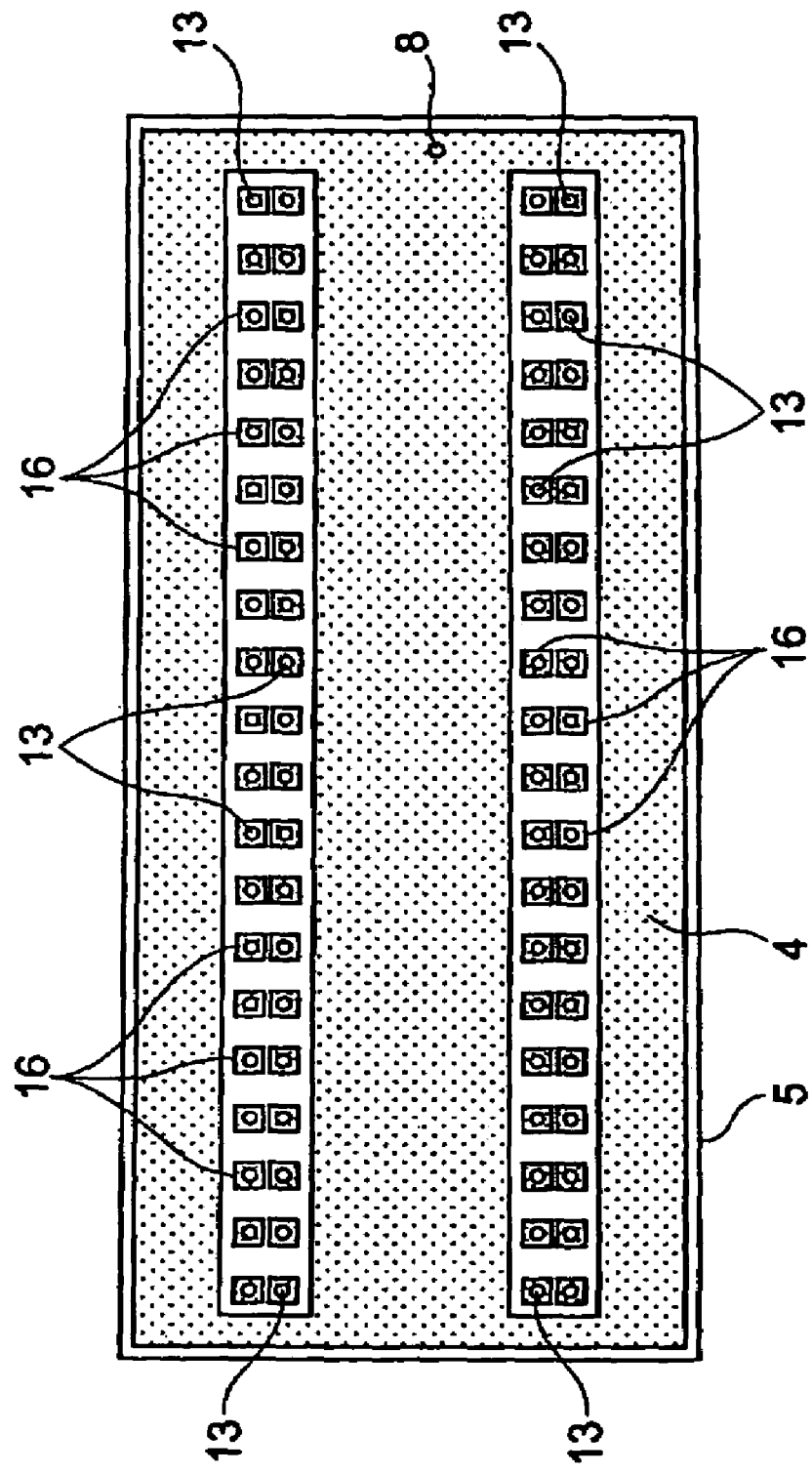
FIG. 5 is a plan view of the second, fourth, sixth, and eighth piezoelectric layers in the multilayer piezoelectric element shown in FIG. 1.

As shown in FIG. 5, intermediate electrodes 16 are formed on the upper face of each of the second, fourth, sixth, and eighth piezoelectric layers 5 from the uppermost piezoelectric layer 7 so as to oppose their corresponding connection portions 12 of the piezoelectric layers 3 in the thickness direction of the multilayer piezoelectric element 1. (In the following, "the thickness direction of the multilayer piezoelectric element 1", i.e., "the thickness direction of the piezoelectric layers 3, 5", will simply be referred to as the thickness direction.) Each intermediate electrode 16 is connected directly thereunder to the conductive substance in the through hole 13 formed in the piezoelectric layer 5

The common electrode 4 is formed on the upper face of the piezoelectric layer 5. The common electrode 4 surrounds each of an assembly of the intermediate electrodes 16 in the first and second columns and an assembly of the intermediate electrodes 16 in the third and fourth columns with a predetermined gap therebetween. As shown in FIG. 3, the common electrode 4 has a shape to overlay the electrode portions 11 across the piezoelectric layers 3, 5 (on the upper face thereof). In other words, the common electrode 4 has a shape to overlay the electrode portions 11 of the piezoelectric layer 3 as a whole as seen in the thickness direction. As a consequence, the whole part opposing the electrode portions 11 in the piezoelectric layers 3, 5 can effectively be used as an active portion contributing to vibration.

The common electrode 4 is formed with a predetermined gap from the outer peripheral part of the piezoelectric layer 5. The common electrode 4 is connected to the conductive substance in the through hole 8. The through hole 8 is formed in the piezoelectric layer 5 so as to oppose the intermediate electrode 6 in the piezoelectric layer 3 in the thickness direction.

Figure 6:
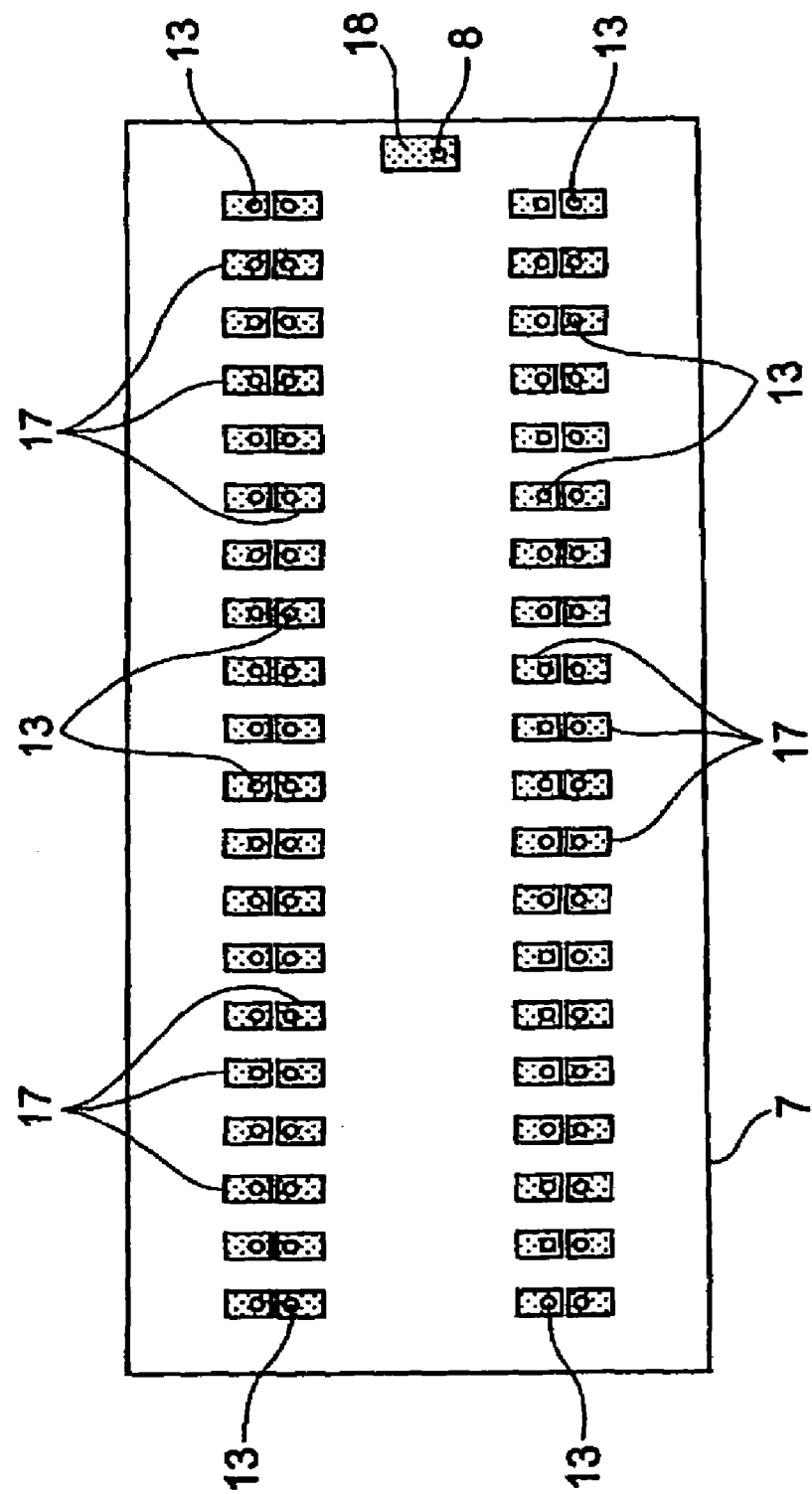
FIG. 6 is a plan view of the uppermost piezoelectric layer in the multilayer piezoelectric element shown in FIG. 1.

As shown in FIG. 6, the upper face of the uppermost piezoelectric layer 7 is formed with external electrodes 17 opposed to their corresponding intermediate electrodes 16 of the piezoelectric layer 5 in the thickness direction, and an external electrode 18 opposed to the intermediate electrode 6 of the piezoelectric layer 3 in the thickness direction. Each external electrode 17 is connected directly thereunder to the conductive substance in the through hole 13 formed in the piezoelectric layer 7, whereas the external electrode 18 is connected directly thereunder to the conductive substance in the through hole 8 formed in the piezoelectric layer 7. Each of the external electrodes 17, 18 is provided with a silver baked electrode for attaching thereto a lead to be electrically connected to a driving power supply, and functions as a terminal electrode for the multilayer piezoelectric element 1.

Figure 7:
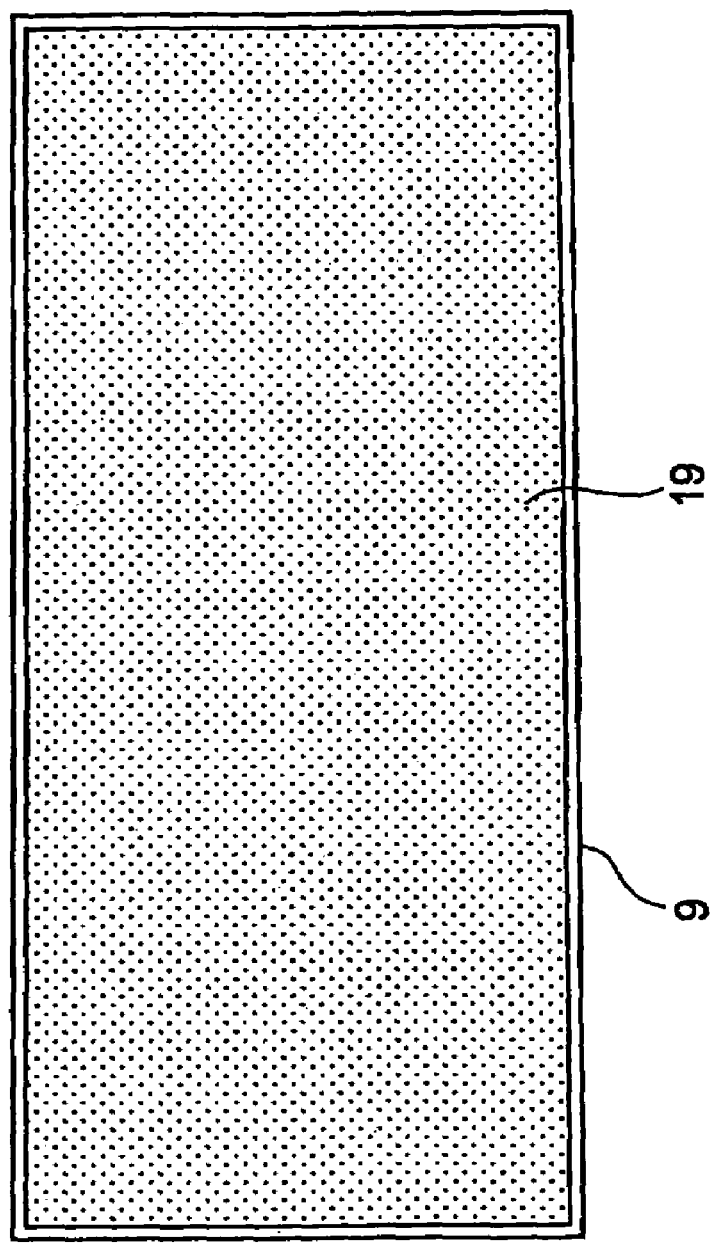
FIG. 7 is a plan view of the lowermost piezoelectric layer in the multilayer piezoelectric element shown in FIG. 1.

As shown in FIG. 7, on the upper face of the lowermost piezoelectric layer 9, a rectangular common electrode 19 having an outer form equivalent to that of the common electrode 4 of the piezoelectric layer 5 is formed with a predetermined gap from the outer peripheral part of the piezoelectric layer 9.

The piezoelectric layers 3, 5, 7, 9 thus formed with the electrode patterns are laminated, whereby each piezoelectric layer 3 is formed with the individual electrodes 2 on the upper face as one face, and the common electrode 4 or 19 on the lower face as the other face. On the other hand, each piezoelectric layer 5 is formed with the individual electrodes 2 on the lower face as one face, and the common electrode 4 or 19 on the upper face as the other face.

Figure 8:
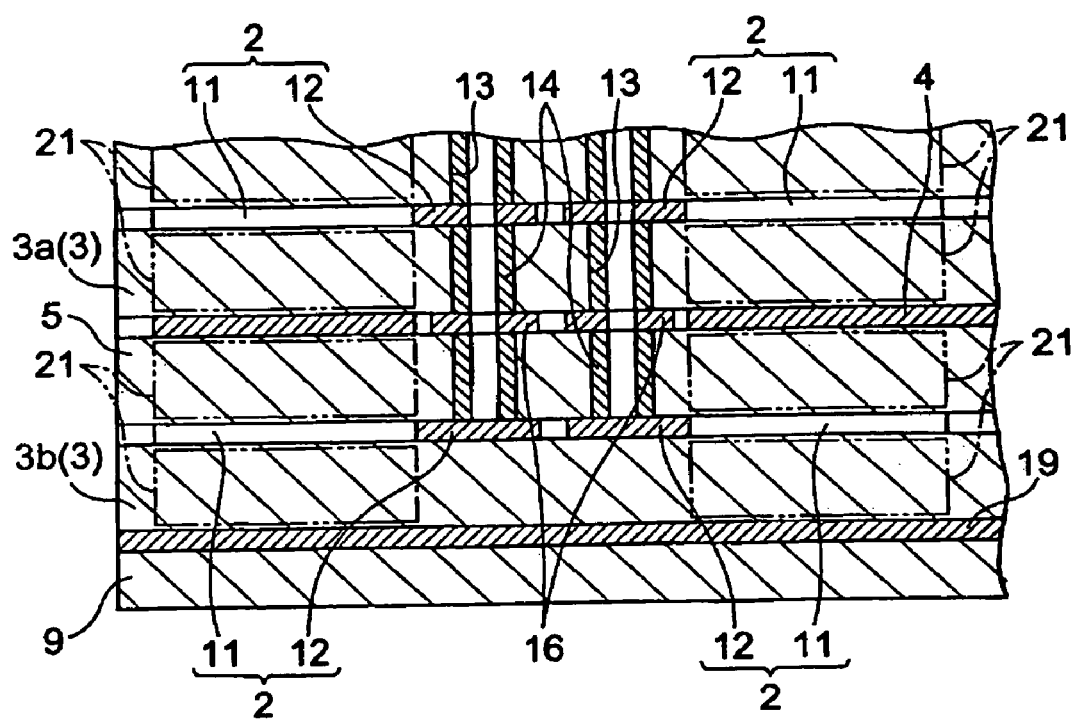
FIG. 8 is an enlarged sectional view taken in a direction perpendicular to the longitudinal direction of the multilayer piezoelectric element shown in FIG. 1.

Four individual electrodes 2 align with each of the external electrodes 17 in the uppermost external electrodes 17 in the thickness direction while the intermediate electrodes 16 are interposed therebetween, so that thus aligned electrodes 2, 16, 17 are electrically connected to each other by the conductive substance within their corresponding through hole 13. More specifically, as shown in FIG. 8, the individual electrodes 2, 2 adjacent each other in the thickness direction are electrically connected to each other by a conductive substance 14 in the through hole 13 by way of the intermediate electrode 16 between their connection portions 12, 12. When the through holes 13, 13 adjacent each other in the thickness direction are formed such that their center axes are displaced from each other, they can more reliably connect with the connection portion 12 or intermediate electrode 16 positioned therebetween.

With respect to the external electrode 18 in the uppermost layer, four common electrodes 4 and the common electrode 19 in the lowermost layer align with the intermediate electrode 6 interposed therebetween, whereas thus aligned electrodes 4, 6, 18, 19 are electrically connected to each other by the conductive member in the through hole 8.

Such electric connections in the multilayer piezoelectric element 1 allow a voltage applied between a predetermined external electrode 17 and the external electrode 18 to cause a voltage between the individual electrode 2 and common electrodes 4, 19 aligned under the predetermined external electrode 17. As a consequence, an electric field occurs in the part held between the electrode portion 11 of the individual electrode 2 and the common electrodes 4, 19 as shown in FIG. 8, whereby this part is displaced as an active portion 21 (region schematically indicated by the dash-double-dot line). Hence, by selecting an external electrode 17 for applying a voltage, the active portion 21 located under thus selected external electrode 17 among the active portions 21 corresponding to the respective individual electrodes 2 arranged in a matrix can be displaced in the thickness direction. Therefore, the multilayer piezoelectric element 1 can be employed as a driving source for various apparatus necessitating minute displacements such as valve control of micropumps.

When a voltage is applied between a predetermined individual electrode 2 and the common electrodes 4, 19 in thus configured multilayer piezoelectric element 1, the active portion 21 therebetween is displaced, whereby the electrode portion 11 of the individual electrode 2 bulges upward from the longitudinal direction like a bow. Here, the displacement in the thickness direction is restricted since the connection portion 12 of the individual electrode 2 is connected to the intermediate electrodes 16 positioned on the upper and lower sides by way of the conductive substance 14.

However, as shown in FIG. 3, the connection portion 12 is formed at a position shifted from the longitudinal centerline L of the electrode portion 11 at the end part 11a of the electrode portion 11 (i.e., displaced from a centerline orthogonal to the longitudinal direction of the electrode portion 11 as well). Also, the connection portion 12 is connected to the electrode portion 11 by way of the narrow neck portion 12a. The neck portion 12a is narrower than the width of the electrode portion 11.

As a consequence, the electrode portion 11 is more likely to flex in conformity to the displacement of the active portion 21 as compared with the case where the connection portion 12 is directly formed on the centerline L extending along the longitudinal direction of the electrode portion 11, for example. Therefore, the multilayer piezoelectric element 1 can prevent the amount of displacement of the active portion 21 from decreasing, whereby the active portion can fully be displaced.

Since the active portion 21 can fully exhibit its displacement, each individual electrode 2 can be made smaller, whereby the multilayer piezoelectric element 1 itself can be made smaller or the individual electrodes 2 can achieve such a high integration of 4 columns by 75 rows within a rectangle of 10 mm×30 mm.

After each external electrode 17 formed on the upper face of the uppermost piezoelectric layer 7 is provided with a silver baked electrode, a lead is connected thereto with soldering or the like while using a flexible printed circuit (FPC) board or the like. Since each external electrode 17 is positioned above the connection portion 12 of the individual electrode 2, the lead is prevented from pressing the electrode portion 11 and active portion 21 of the individual electrode 2 and inhibiting their displacement.

As mentioned above, the connection portion 12 is formed at a position shifted from the electrode portion 11 and thus is less susceptible to the displacement of the electrode portion 11, whereby the external electrode 17 positioned above the connection portion 12 is less vulnerable to the displacement. This can more reliably keep the connection between the connection portion 12 and the lead.

In the following procedure, the multilayer piezoelectric element 1 is produced. First, a piezoelectric material mainly composed of ceramics such as lead zirconate titanate is mixed with an organic binder, an organic solvent, and the like, so as to yield a paste, from which green sheets to become the piezoelectric layers 3, 5, 7, 9 are formed. Also, a metal material composed of silver and palladium at a predetermined ratio is mixed with an organic binder, an organic solvent, and the like, so as to yield a conductive paste for forming an electrode pattern.

Subsequently, the green sheets to become the piezoelectric layers 3, 5, 7, 9 are irradiated with laser light at predetermined positions, so as to form through holes 8, 13. Thereafter, the through holes 8, 13 are subjected to filling screen printing with the conductive paste, so as to form a conductive substance 14. Further, the green sheets are subjected to screen printing with the conductive paste, so as to form electrodes 2, 4, 17, 19 and the like.

The green sheets thus formed with the electrode patterns are laminated in the above-mentioned order and pressed in the laminating direction, so as to yield a green laminate. The green laminate is degreased, fired, and then polarized, so as to finish the multilayer piezoelectric element 1.

In the making of the multilayer piezoelectric element 1 in the foregoing, electrodes for producing an electric field in the piezoelectric layer in cooperation with the electrode portions 11 of the individual electrodes 2 are formed as common electrodes 4, 19, whereby it becomes easier to form patterns of the electrodes and position them with respect to their opposing electrode portions 11.

[Second Embodiment]

Figure 9:
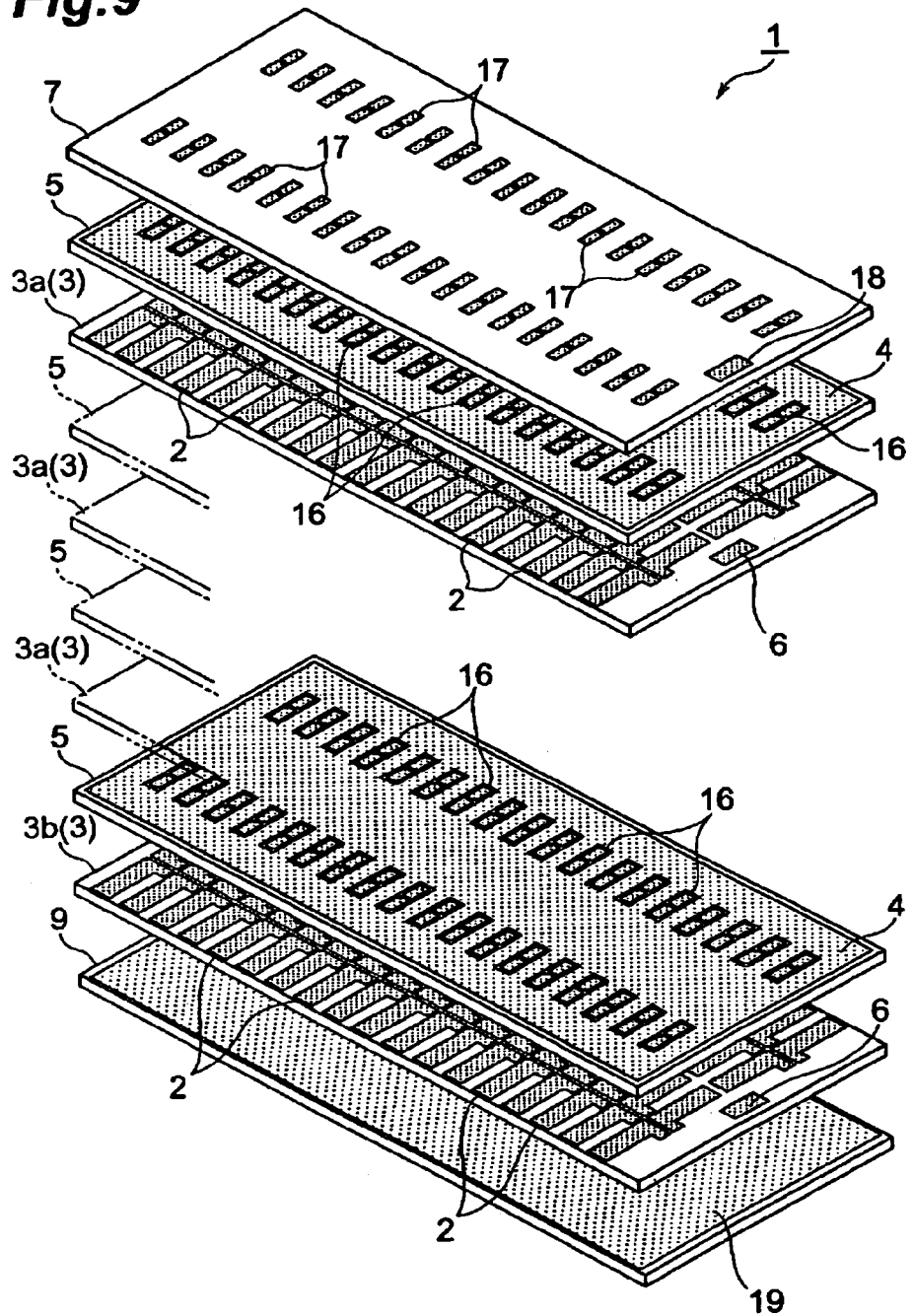
FIG. 9 is an exploded perspective view of a second embodiment of the multilayer piezoelectric element in accordance with the present invention.

As shown in FIG. 9, the multilayer piezoelectric element 1 in accordance with the second embodiment is constituted by a laminate pattern similar to that of the multilayer piezoelectric element 1 in accordance with the first embodiment but differs therefrom mainly in the form of individual electrodes 2. In the following, the multilayer piezoelectric element 1 in accordance with the second embodiment will be explained mainly in terms of differences from the multilayer piezoelectric element 1 in accordance with the first embodiment.

Figure 10:
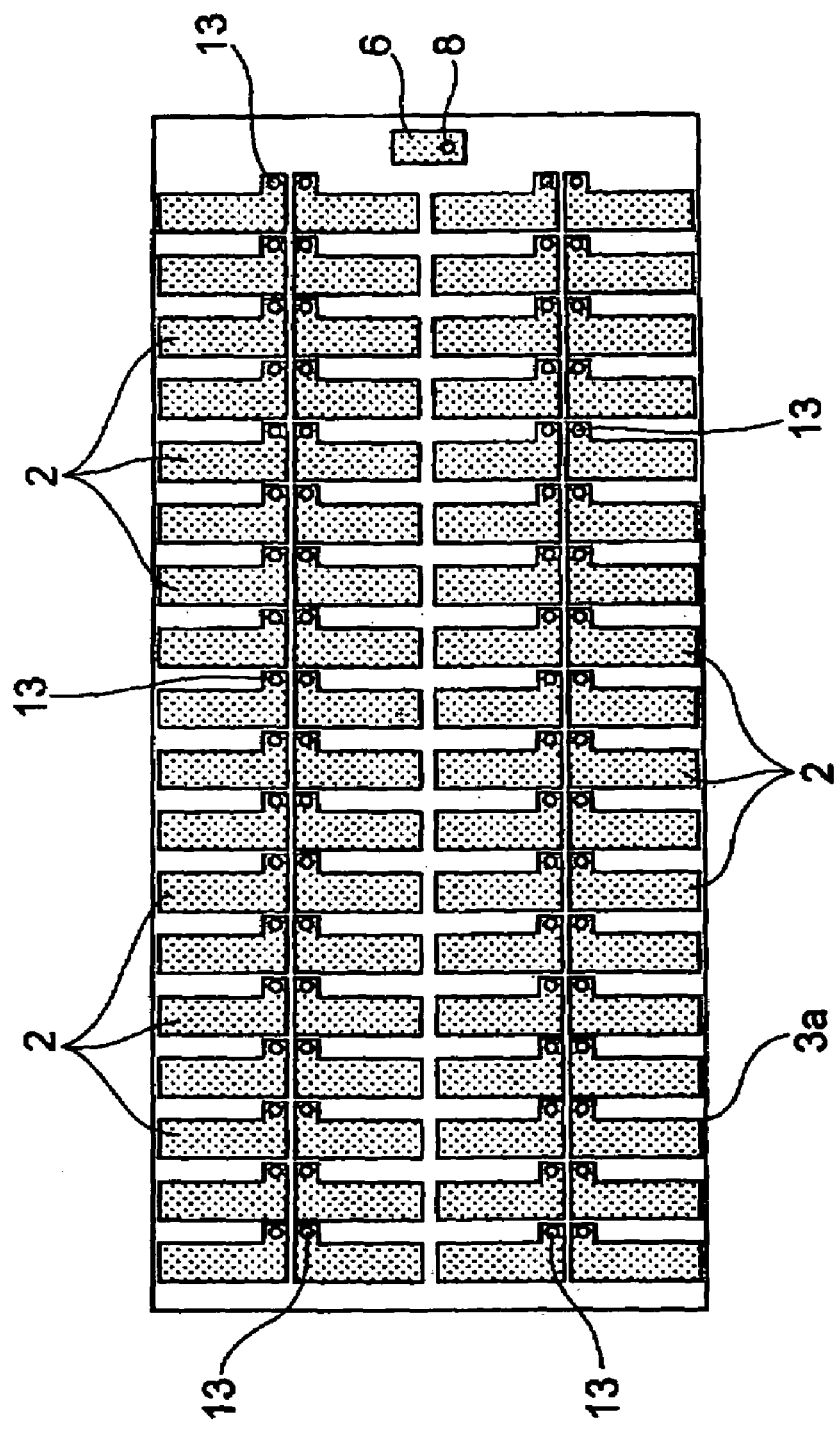
FIG. 10 is a plan view of the third, fifth, and seventh piezoelectric layers in the multilayer piezoelectric element shown in FIG. 9.

As shown in FIG. 10, a number of individual electrodes 2 arranged in a matrix of 4 columns by 75 rows (only 4 columns by 18 rows being depicted for the sake of clarification), for example, and an intermediate electrode 6 connected to a conductive substance in a through hole 8 are formed on the upper face of each of the third, fifth, and seventh layers from the uppermost piezoelectric layer 7.

Figure 11:
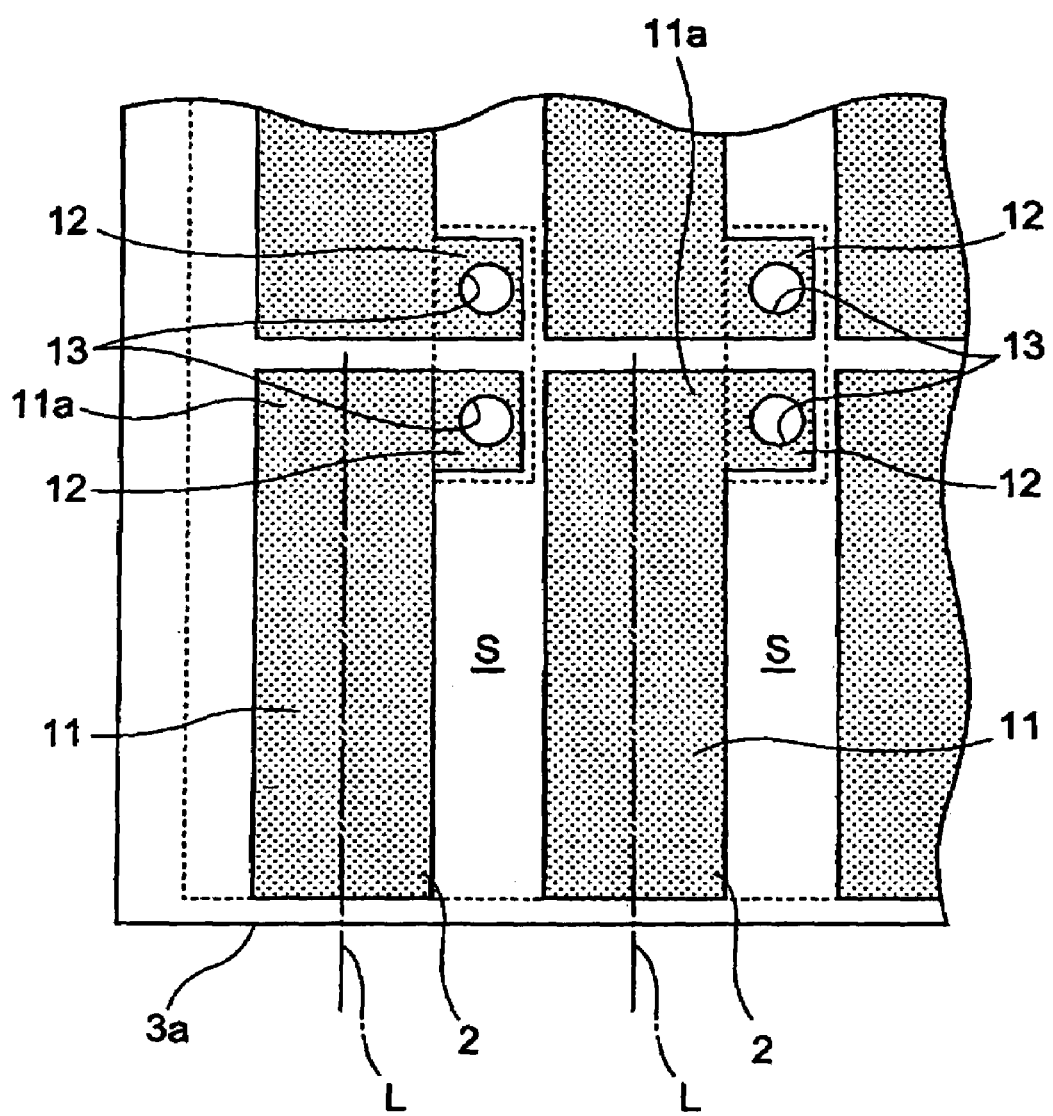
FIG. 11 is an enlarged plan view showing a main part of the piezoelectric layers shown in FIG. 10.

As shown in FIG. 11, each individual electrode 2 includes a rectangular electrode portion 11 for producing, in cooperation with a common electrode 4, an electric field in the piezoelectric layer 3a. A square connection portion 12 connected to a conductive substance in the through hole 13 is integrally formed with one longitudinal end part 11a of the electrode portion 11. While having the center of gravity position shifted from the longitudinal centerline L of the electrode portion 11, the connection portion 12 is positioned in a space S between the electrode portions 11, 11 adjacent each other in a direction orthogonal to the longitudinal direction.

Figure 12:
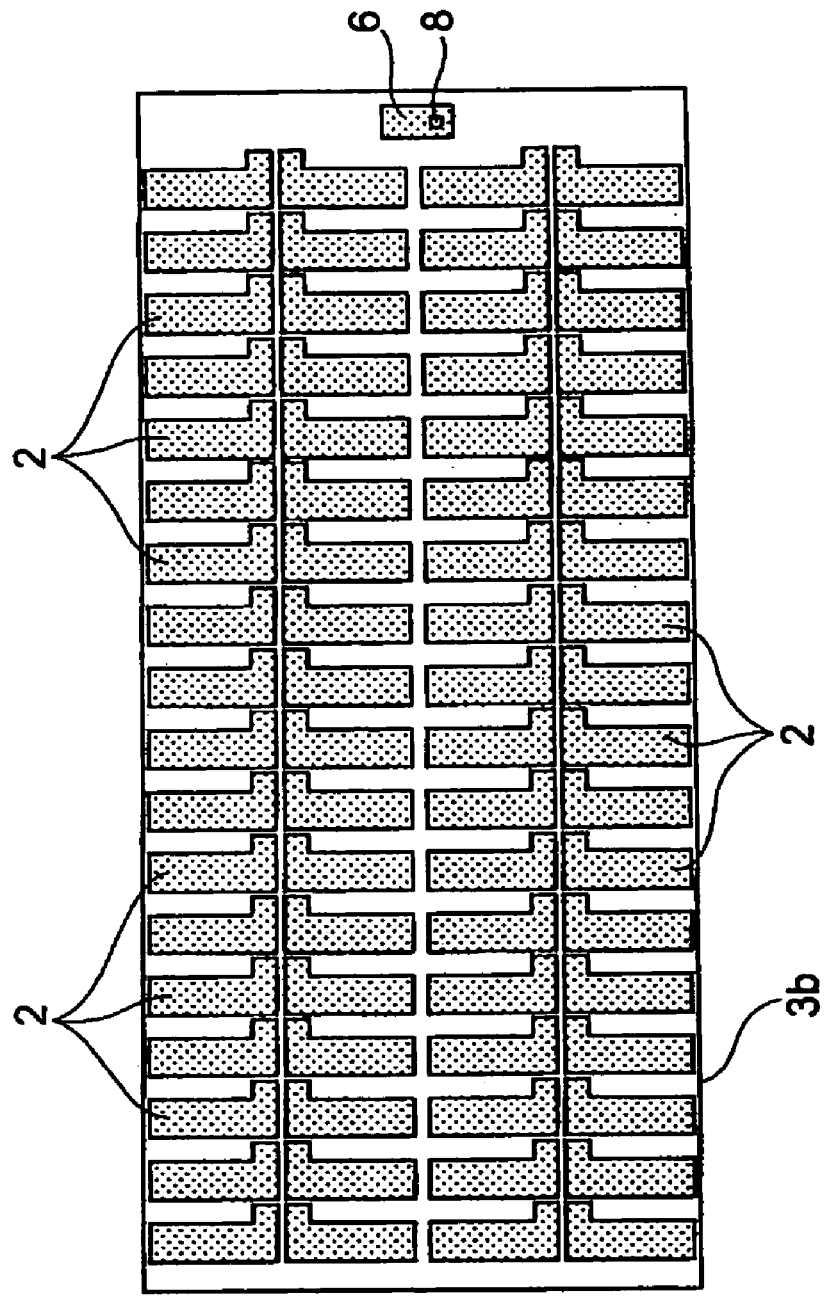
FIG. 12 is a plan view of the ninth piezoelectric layer in the multilayer piezoelectric element shown in FIG. 9.

Individual electrodes 2 are also disposed in a matrix on the upper face of the ninth piezoelectric layer 3b as shown in FIG. 12. However, the ninth piezoelectric layer 3b differs from the piezoelectric layers 3a in that no through holes 13 are formed.

Figure 13:
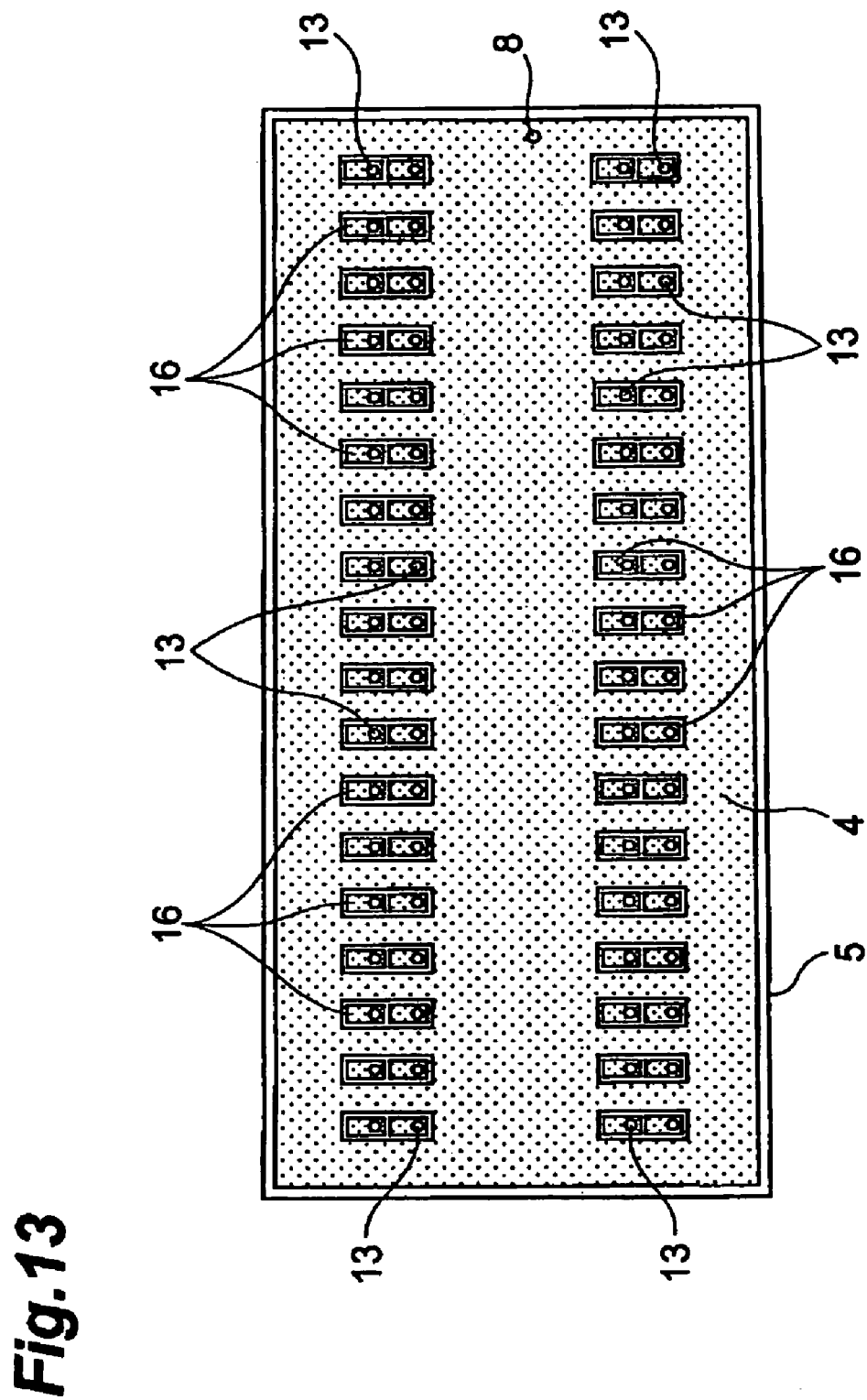
FIG. 13 is a plan view of the second, fourth, sixth, and eighth piezoelectric layers in the multilayer piezoelectric element shown in FIG. 9.

As shown in FIG. 13, intermediate electrodes 16 are formed on the upper face of each of the second, fourth, sixth, and eighth piezoelectric layers 5 from the uppermost piezoelectric layer 7 so as to oppose their corresponding connection portions 12 of the piezoelectric layer 3 in the thickness direction, and are connected to their corresponding conductive substances in the through holes 13.

A common electrode 4 is formed on the upper face of the piezoelectric layer 5 so as to surround each of groups of the intermediate electrodes 16 in the first and second columns and groups of the intermediate electrodes 16 in the third and fourth columns with a predetermined gap therebetween, whereas the common electrode 4 is connected to a conductive substance in the through hole 8. As shown in FIG. 11, the common electrode 4 also has a shape to overlay the electrode portions 11 of the piezoelectric layer 3 across the piezoelectric layers 3, 5.

Figure 14:
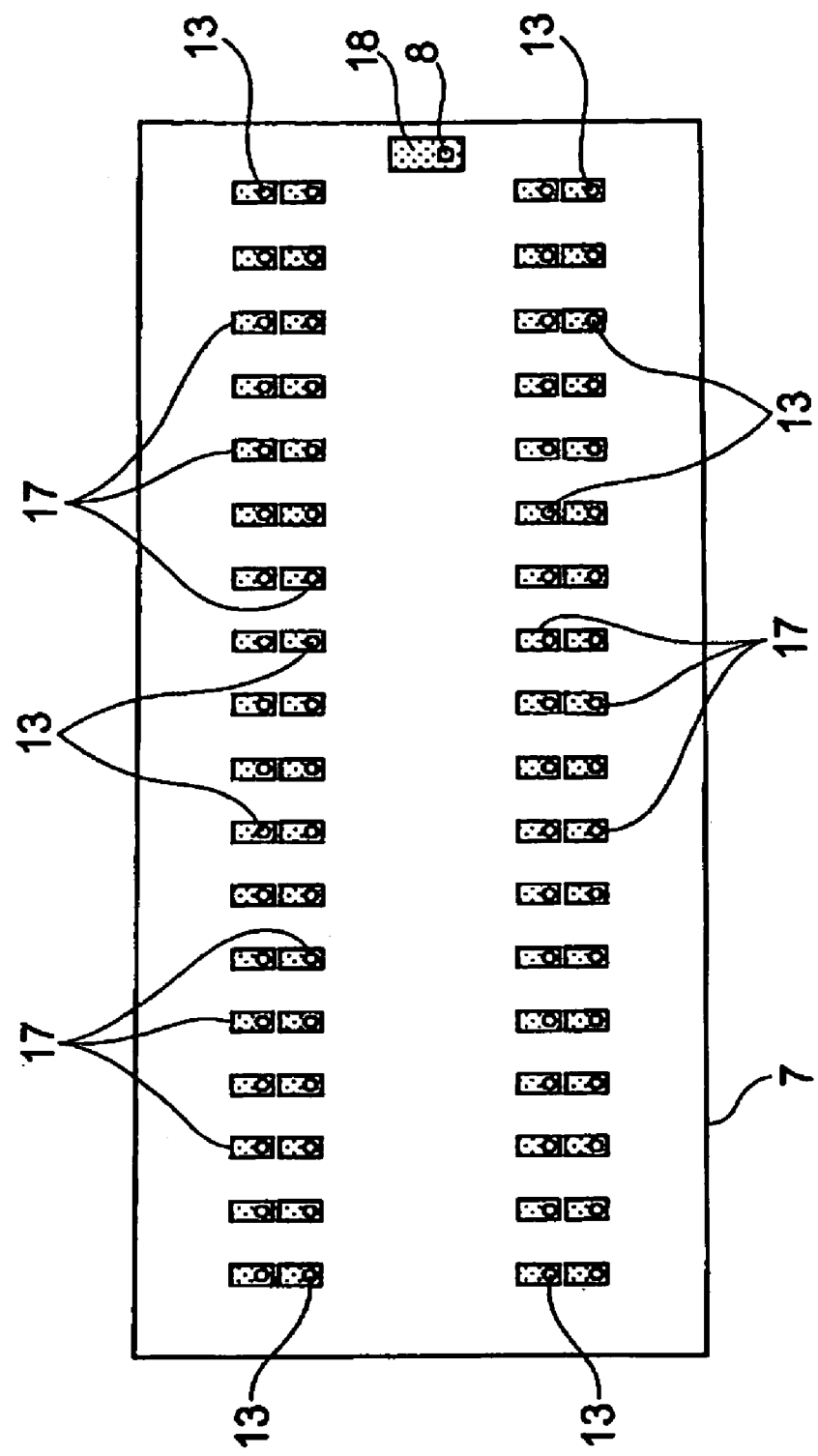
FIG. 14 is a plan view of the uppermost piezoelectric layer in the multilayer piezoelectric element shown in FIG. 9.

As shown in FIG. 14, the upper face of the uppermost piezoelectric layer 7 is formed with external electrodes 17 opposed to their corresponding intermediate electrodes 16 of the piezoelectric layer 5 in the thickness direction, whereas the external electrodes 17 are connected to their corresponding conductive substances in the through holes 13. Further, an external electrode 18 is formed so as to oppose to the intermediate electrode 6 of the piezoelectric layer 3 in the thickness direction, and is connected to the conductive substance in the through hole 8. As in FIG. 7, the upper face of the lowermost piezoelectric layer 9 is formed with a rectangular common electrode 19 having an outer form equivalent to that of the common electrode 4 of the piezoelectric layer 5.

Laminating the piezoelectric layers 3, 5, 7, 9 formed with the electrode patterns as in the foregoing achieves electric connections similar to those in the multilayer piezoelectric element 1 in accordance with the first embodiment. In the piezoelectric layer 3 of the multilayer piezoelectric element 1 in accordance with the second embodiment, however, the connection portion 12 of each individual electrode 2 is positioned in the space S between the electrode portions 11, 11 adjacent each other. As a consequence, the individual electrodes 2 can be disposed more efficiently on the piezoelectric layer 3. This makes it possible to reduce the size of the multilayer piezoelectric element 1 or achieve higher integration of the individual electrodes 2, while keeping the area of each active portion in the multilayer piezoelectric element 1.

From a different viewpoint, assuming that the multilayer piezoelectric element 1 has a fixed size, each electrode portion 11 can be made longer in the longitudinal direction thereof since the connection portion 12 is positioned in the space S between the electrode portions 11, 11, whereby the active length of each active portion 21 in the multilayer piezoelectric element 1 can be made longer.

The present invention is not restricted to the above-mentioned first and second embodiments. For example, though the first and second embodiments relate to cases where the electrode portion 11 of each individual electrode 2 has a rectangular form whereas each connection portion 12 has a square form, the electrode portion 11 and connection portion 12 may have various forms. For example, the electrode portion 11 and connection portion 12 may have elliptical and circular forms, respectively. Even in such various forms, operations and effects similar to those in the first and second embodiments are obtained when each individual electrode 2 is formed such that the connection portion 12 is shifted from the longitudinal centerline L of the electrode portion 11.

As explained in the foregoing, the multilayer piezoelectric element in accordance with the present invention can prevent the amount of displacement of active portions in piezoelectric layers from decreasing.

The basic Japanese Patent Application No. 2003-051762 filed on Feb. 27, 2003 is hereby incorporated by reference.

What is claimed is:

1. A multilayer piezoelectric element comprising:
   a first internal electrode;
   a second internal electrode; and
   a piezoelectric layer, disposed between the first and second internal electrodes, including a through hole in which a conductive substance is disposed;
   wherein the first internal electrode has an electrode portion for producing, in cooperation with the second internal electrode, an electric field in the piezoelectric layer, and a connection portion connected to the conductive substance in the through hole; and
   wherein the connection portion is formed at a position shifted from the longitudinal centerline of the electrode portion.

2. A multilayer piezoelectric element according to claim 1, wherein the first internal electrode is an individual electrode, and a plurality of individual electrodes are formed on one face of the piezoelectric layer.

3. A multilayer piezoelectric element according to claim 2, wherein the plurality of individual electrodes are disposed in a matrix on the piezoelectric layer.

4. A multilayer piezoelectric element according to claim 2, wherein the connection portion is positioned between adjacent electrode portions.

5. A multilayer piezoelectric element according to claim 2, wherein the second internal electrode is a common electrode, and is formed on the other face of the piezoelectric layer while having a shape to overlay the electrode portion across the piezoelectric layer.

6. A multilayer piezoelectric element according to claim 1, further comprising an outermost layer laminated on a top of a plurality of piezoelectric layers;
   wherein the outermost layer has an external electrode opposed to the connection portion in a thickness direction of the piezoelectric element.

* * * * *